United States Patent
Egger et al.

(12)

(10) Patent No.: US 6,867,053 B2
(45) Date of Patent: Mar. 15, 2005

(54) FABRICATION OF A FERAM CAPACITOR USING A NOBLE METAL HARDMASK

(75) Inventors: Ulrich Egger, Kanagawa-ken (JP); Haoren Zhuang, Tokyo-to (JP); Rainer Bruchhaus, Kanagawa-ken (JP)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/629,326
(22) Filed: Jul. 28, 2003
(65) Prior Publication Data
US 2005/0023582 A1 Feb. 3, 2005

(51) Int. Cl.[7] .................... H01L 21/00; H01L 21/8234
(52) U.S. Cl. .................... 438/3; 438/238; 438/240; 438/253; 438/254; 257/295
(58) Field of Search ................. 438/239–242, 438/253–256, 387, 396, 397–399, 608, 706; 257/295

(56) References Cited

U.S. PATENT DOCUMENTS 6,497,992 B1 * 12/2002 Yunogami et al. .......... 430/313
6,713,310 B2 * 3/2004 Song et al. ..................... 438/3
6,746,878 B2 * 6/2004 Komuro et al. ................ 438/3

* cited by examiner

Primary Examiner—Donghee Kang
(74) Attorney, Agent, or Firm—Fish & Richardson P.C.

(57) ABSTRACT

A ferroelectric capacitor is fabricated using a noble metal hardmask. A hardmask is deposited on a top electrode of a capacitor stack comprising a ferroelectric layer sandwiched between the top electrode and a bottom electrode. The top electrode is patterned according to the pattern of the hardmask by etching at a first temperature. The top electrode serves as the noble metal hardmask and the ferroelectric layer is patterned according to the pattern of the top electrode at a second temperature lower than the first temperature, resulting in the top electrode having sidewalls beveled relative to a top surface of the top electrode etching. The bottom electrode is etched at a third temperature to form the capacitor.

7 Claims, 4 Drawing Sheets

FABRICATION OF A FERAM CAPACITOR USING A NOBLE METAL HARDMASK

FIELD OF THE INVENTION

The present invention relates to a hardmask used to etch ferroelectric capacitors.

BACKGROUND OF THE INVENTION

Ferroelectric capacitors are often used in FeRAMs. The ferroelectric capacitors are etched in one or more steps. FIG. 1 illustrates a two-step prior-art process for etching a ferroelectric capacitor. A top electrode (TE) 101 and an underlying ferroelectric layer 103 are patterned by a first etching step as shown in FIG. 1(b). An underlying bottom electrode (BE) 105 is patterned by a second etching step as shown in FIG. 1(c).

Turning to FIG. 1(a), a wafer stack 100 is illustrated. Sandwiched between the top electrode 101 and the bottom electrode 105 is the ferroelectric layer 103. The top and bottom electrodes 101, 105 are composed of a noble metal such as Platinum or Iridium. The ferroelectric layer 103 can be formed of PZT, for example. The top electrode 101, ferroelectric layer 103, and bottom electrode 105 are supported by a substrate 109.

A first Ithographic step is performed whereby a first hardmask 107, often composed of TEOS, is applied on the top electrode 101 for etching the top electrode during the first etching step. During the first etching step the exposed areas of the top electrode 101 and the ferroelectric layer 103 are etched away following the pattern of the first hardmask 107.

The thickness of the first hardmask 107 is chosen according to the selectivity between the hardmask 107 material and the material of the top electrode 101 and the ferroelectric layer 103. The hardmask 107 must be thick enough so that the top electrode and ferroelectric layer are patterned before the hardmask is etched away, exposing the top electrode. Typically, the hardmask must be thicker than the stack itself, resulting in an etching process sensitive to small changes in composition and stack thickness. If the hardmask is thick compared to the capacitor thickness, unwanted residues are easily formed on the sidewalls. These undesirable effects are common when silicon dioxide (TEOS) is used for the first hardmask 107 and Pt is used for the top electrode.

After etching the top electrode 101 and the ferroelectric layer, a second lithographic step is performed whereby a second hardmask 111 is applied over remaining portions of the first hardmask 107, top electrode 101, ferroelectric layer 103, and bottom electrode 105. FIG. 1(b) shows the stack 100 following the deposition of the second hard mask 111.

During the second etching step the exposed areas of the bottom electrode 105, and sometimes some of the substrate 109, are etched away following the pattern of the second hardmask 111. The bottom electrode 105 also includes a barrier layer which is etched along with the bottom electrode 105. FIG. 1(c) shows the stack 100 following the second etching step.

The hardmasks used for both the first and second etching steps cause unwanted residues ("fences") clinging to the sidewalls. Moreover, the thick hardmask layers result in overly thick capacitors. The steps for depositing the hardmask layers also adds complexity to the fabrication process.

A hardmask that would allow the simplified fabrication of a relatively thin capacitor stack, with fewer undesirable residues, would be beneficial.

SUMMARY OF THE INVENTION

The present invention uses the top electrode as a noble metal hardmask resulting in simplification of the fabrication process, a thinner capacitor stack and reduced fences.

In general terms, the invention is a ferroelectric capacitor which is fabricated using a noble metal hardrhask and also the method for fabricating the capacitor using the noble metal hardmask. A hardmask is deposited on a top electrode of a capacitor stack comprising a ferroelectric layer sandwiched between the top electrode and a bottom electrode. The top electrode is patterned according to the pattern of the hardmask by etching at a first temperature. The top electrode serves as a hardmask and the ferroelectric layer is patterned according to the pattern of the top electrode at a second temperature lower than the first temperature, resulting in the top electrode having sidewalls beveled relative to a top surface of the top electrode etching. The bottom electrode is etched at a third temperature to form the capacitor.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 6A:
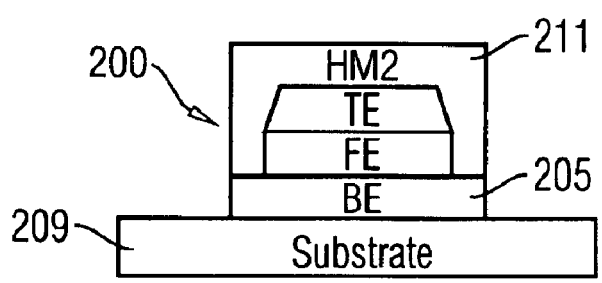
FIGS. 6a and 6b show the capacitor stack after patterning of the bottom electrode.
Figure 6B:
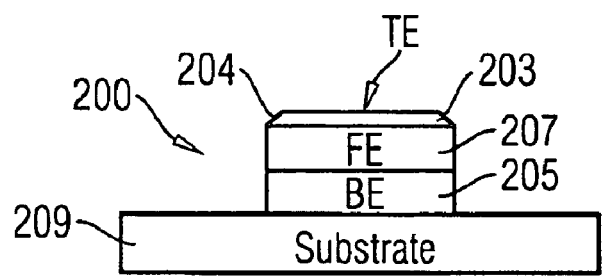
Figure 7:
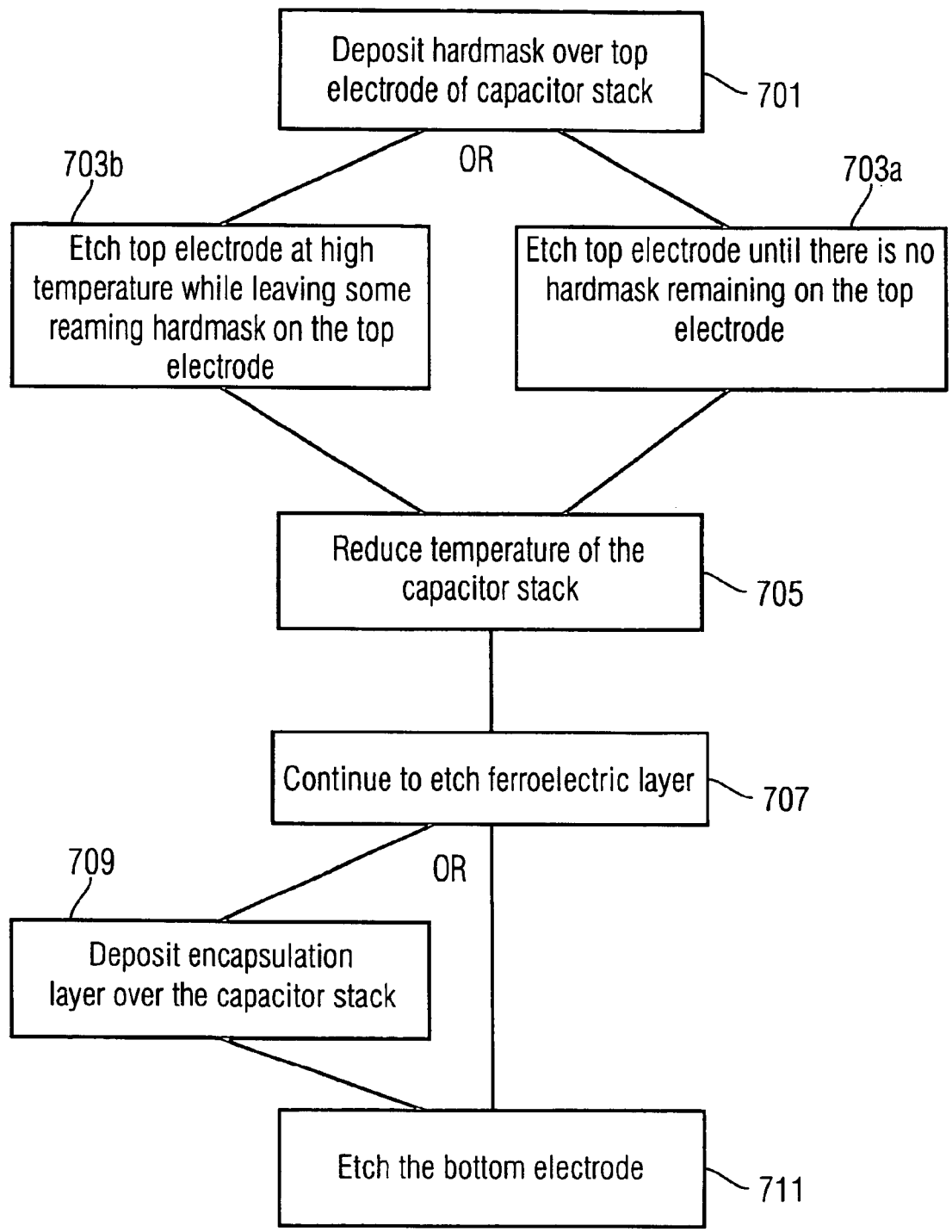
FIG. 7 is a flowchart illustrating the method for fabricating the capacitor stack of FIGS. 6a and 6b.

The method steps for using a metal hardmask to fabricate a capacitor are described by the flow-chart of FIG. 7. FIGS. 2–6 schematically illustrate the process for etching a ferroelectric capacitor using a metal hardmask. The present invention takes advantage of the relatively more rapid etching of the ferroelectric layer than the top electrode at lower temperatures, allowing the top electrode to serve as a hardmask.

Figure 1A:
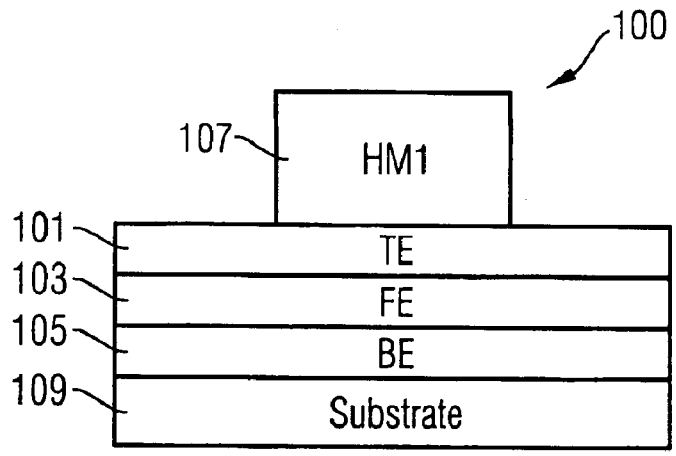
FIGS. 1a–1c shows a prior-art process for etching a ferroelectric capacitor.
Figure 1B:
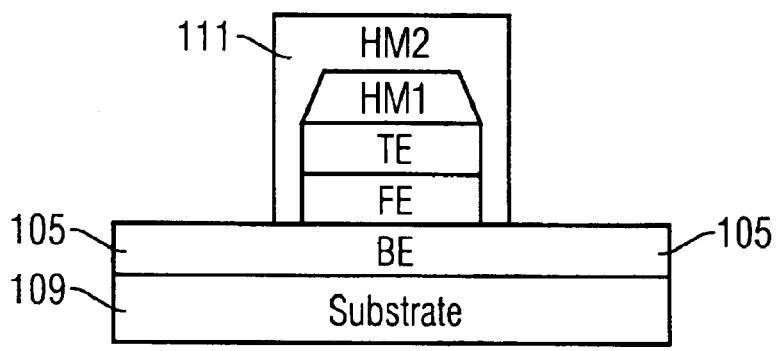
Figure 1C:
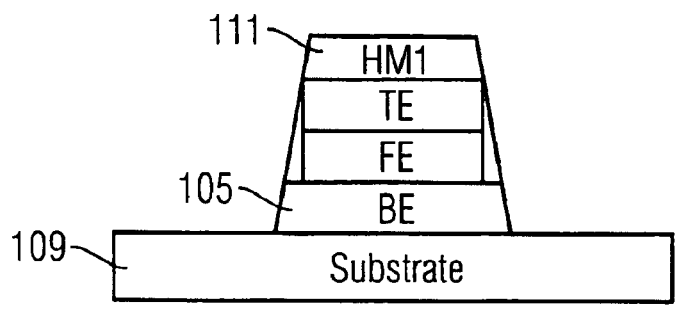
Figure 2:
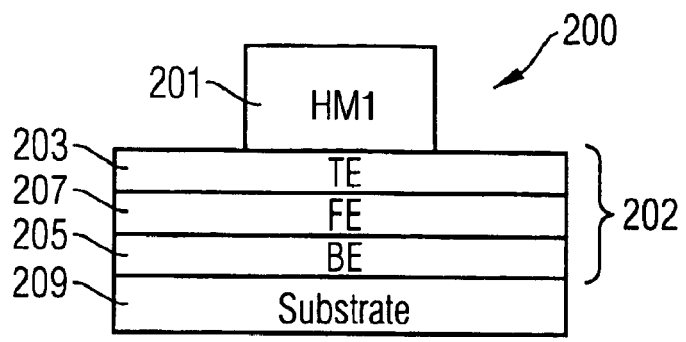
FIG. 2 shows a capacitor stack, along with a hardmask deposited on a top electrode, for processing according to the present invention.

FIG. 2 shows a wafer stack 200. Sandwiched between a top electrode 203 and a bottom electrode 205 is a ferroelectric layer 207. In this illustrative example the top and bottom electrodes 101, 105 are composed of the noble metal Platinum (Pt), and the ferroelectric layer 207 is formed of PZT. The top electrode 203, ferroelectric layer 207, and bottom electrode 205 form a capacitor 202 which is supported by a substrate 209.

A first lithographic step is performed whereby a TE hardmask 201 is deposited on the top electrode 203 (step 701 of FIG. 7). The TE hardmask 201 is used for etching the top electrode. In the present example the TE hardmask 201 is formed from TEOS.

During a first etching step (steps 703) the exposed areas of the top electrode 203 are etched away following the pattern of the TE hardmask 201. The noble metal forming the top electrode 203 is etched at a high temperature T1. For Pt a suitable temperature during the etching of the top electrode 203 at steps 703 is between 250–400 degC. The energy to heat the wafer stack 200 is commonly supplied by a direct contact with a heated electrostatic chuck. The high temperature is required to create volatile elements for the noble metal.

Figure 3A:
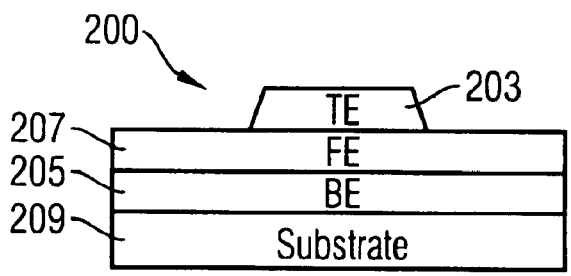
FIGS. 3a and 3b show the capacitor stack after etching of the top electrode using the hardmask.
Figure 3B:
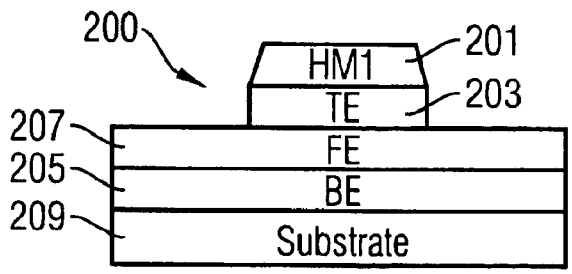

The etching can be performed until the hardmask 201 is completely etched away (see FIG. 3a and step 703a) or the etching can be performed so that some of the hardmask 201 remains to cover the top electrode 203 (see FIG. 3b and step 703b). The present invention differs from the prior art in that the ferroelectric layer 207 is not completely etched away at this step. The etching is stopped when the metal layer 203 is substantially removed from the ferroelectric 207 over the regions not protected by the top electrode 203.

Next, at step 705 the temperature of the wafer is reduced to reach an etching regime where the volatility of the noble metal forming the metal layer 203, is reduced. The etch rate for the noble metal decreases faster with temperature than the ferroelectric layer. The criteria for the required temperature reduction is the selectivity between the ferroelectric layer and the top electrode hardmask (TE). The temperature of the wafer stack 200 and thickness of the top electrode 203 must be such that in the subsequent etching step the ferroelectric is etched away and patterned by the top electrode 203 before the top electrode 203 is completely etched away. For the embodiment in which the top electrode 203 is formed from Pt and the ferroelectric layer 207 is formed from PZT, the temperature should be reduced from the 250–400 degC temperature by approximately 50–100 degC (resulting in a range of lower temperatures from approximately 150–350 degC). A preferred temperature range is from 150–250 degC. The temperature change can be achieved by moving the wafer 200 from an etching chamber having the higher temperature T1 to an etching chamber having a lower temperature T2 at the step 705.

Figure 4:
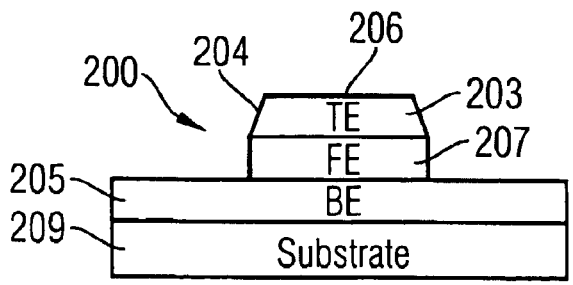
FIG. 4 shows the capacitor stack following etching of a ferroelectric layer using the top electrode as a hardmask.

At step 707 the etching of the ferroelectric layer 207 proceeds at the lower temperature T2 until the ferroelectric layer 207 is patterned by the top electrode 203 to expose the bottom electrode 205 as shown in FIG. 4. The etching step 707 can also be continued until there is an overetch into the bottom electrode 205. As can be seen from FIG. 4, the top electrode 203 is eroded during this etching. At the low temperature T2, this leads to faceting of the Pt hardmask top electrode 203. Sidewalls 204 (see FIG. 4) of the top electrode 203 are beveled relative to a top surface of the top electrode 206. Here "bevel" is defined as "the angle or inclination of a line or surface that meets another at any angle but 90°". Due to the dominating physical component during this etching step, the crystal symmetry of the Pt material leads to this characteristic shape (a tapered shape having a facet angle which can be approximately 60 degrees) of the noble metal hardmask top electrode 203.

Figure 5:
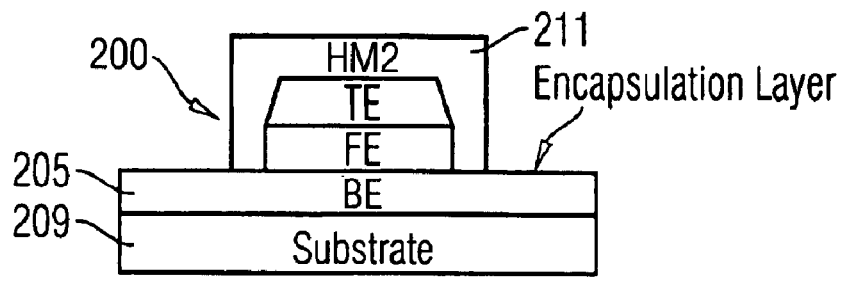
FIG. 5 shows the optional encapsulation of the capacitor stack with another hardmask.

An optional step 709 is then performed wherein the capacitor 102 is enclosed by a second hardmask, or encapsulation layer 211 as illustrated in FIG. 5. The encapsulation layer 211 can be composed of TEOS, for example.

Next, a step 711 is performed wherein the bottom electrode is patterned at a suitable temperature T3 which, in some cases, is the same as either T1 or T2.

For the case when the optional step 709 is performed first to enclose the capacitor 102, the encapsulation layer 211 protects the top electrode 203 and ferroelectric layer 207 while the bottom electrode 205 is patterned. FIG. 6a shows the wafer stack 200 following the etching of the bottom electrode 205.

For the case when step 709 is not performed, or when in step 711 the encapsulation layer 211 is etched away before the bottom electrode 205 is completely patterned, the top electrode 203 can serve as a hardmask for etching the bottom electrode 205. FIG. 6b shows the wafer stack 200 following the etching of the bottom electrode using the top electrode 203 as the hardmask. For this case, the initial thickness of the top electrode 203 in FIG. 2 must be enough so that the top electrode 203 is not etched away completely and can serve as a hardmask during the etching of the ferroelectric layer (step 707) and the bottom electrode (step 711).

In step 711 the etching of the bottom electrode 205 can continue so that there is an overetch into the underlying substrate 209.

The present invention results in decreased sidewall deposition (decreased "fences") during capacitor etching. The uniformity of the thickness of the ILD (inter layer dielectric) layer is improved. Also, etching and filling of TW and VO contacts through the wafer stack 200 becomes more reliable and more controllable.

Although the invention has been described above using particular embodiments, many variations are possible within the scope of the claims, as will be clear to a skilled reader. For example, the top and bottom electrodes 101, 105 can be composed of noble metals other than Platinum (Pt), such as Ir, Pd or Rh. Also, rather than using TEOS for the TE hardmask 201 and encapsulation layer 211, other materials suitable for etching at the required temperatures can be used. For example, the hardmask 201 and encapsulation layer 211 can include $Al_2O_3$, Ti, TiN or TiAlN. The etching processes can use plasma etching with $Cl_2$, F or CO based chemistries, for example.

We claim:

1. A method for etching a capacitor comprising the steps of:
   depositing a hardmask on a top electrode of a capacitor stack comprising a ferroelectric layer sandwiched between the top electrode and a bottom electrode;
   etching at a first temperature to pattern the top electrode according to the pattern of the hardmask;
   etching at a second temperature lower than the first temperature to pattern the ferroelectric layer according to the pattern of the top electrode and resulting in the top electrode having sidewalls beveled relative to a top surface of the top electrode; and
   etching at a third temperature to pattern the bottom electrode to form the capacitor.

2. The method of claim 1, further comprising the step of encapsulating the capacitor with a second hardmask prior to patterning the bottom electrode.

3. The method of claim 1, wherein the patterning of the bottom electrode further comprises using the top electrode to pattern the bottom electrode.

4. The method of claim 1, wherein the top electrode is comprised of Pt and the first temperature is between 250 and 400 degC.

5. The method of claim 1, wherein the second temperature is less than the first temperature by between 50 and 100 degC.

6. The method of claim 1, wherein:
   the etching at the first temperature to pattern the top electrode according to the pattern of the hardmask is performed in a first etching chamber; and
   the etching at the second temperature lower than the first temperature to pattern the ferroelectric layer according to the pattern of the top electrode is performed in a second etching chamber having a temperature lower than the first chamber.

7. The method of claim 1, wherein the third temperature is substantially the same as either the first temperature or the second temperature.

* * * * *